United States Patent
Okada et al.

(10) Patent No.: US 6,577,260 B2
(45) Date of Patent: Jun. 10, 2003

(54) DIGITAL/ANALOGY CONVERTER FOR REDUCING GLITCH

(75) Inventors: Koji Okada, Kasugai (JP); Hiroyuki Matsunami, Tajimi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/819,719

(22) Filed: Mar. 29, 2001

(65) Prior Publication Data

US 2002/0030621 A1 Mar. 14, 2002

(30) Foreign Application Priority Data

Sep. 13, 2000 (JP) .......................... 2000-278735

(51) Int. Cl.$^7$ ................................. H03M 1/66
(52) U.S. Cl. ........................ 341/144; 341/118
(58) Field of Search ................ 341/144, 118, 341/136

(56) References Cited

U.S. PATENT DOCUMENTS

| | | | | |
|---|---|---|---|---|
| 4,958,157 A | * | 9/1990 | Miki et al. | 341/133 |
| 5,801,653 A | * | 9/1998 | Liu et al. | 341/136 |
| 6,275,179 B1 | * | 8/2001 | Mori | 341/144 |
| 6,304,199 B1 | * | 10/2001 | Fang et al. | 341/118 |
| 6,310,568 B1 | * | 10/2001 | Kurooka | 341/144 |
| 6,329,940 B1 | * | 12/2001 | Dedic | 341/144 |
| 6,337,644 B1 | * | 1/2002 | Kasahara | 341/136 |

\* cited by examiner

*Primary Examiner*—Peguy Jeanpierre
(74) *Attorney, Agent, or Firm*—Arent Fox Kintner Plotkin & Kahn

(57) ABSTRACT

A Digital/Analog converter comprising a plurality of current sources, and a selecting circuit for selecting a current source from the plurality of current sources on the basis of a digital signal. The selecting circuit includes a first transistor in which the digital signal is supplied. The selecting circuit also includes a second transistor with the same conductivity type as the first transistor for receiving an inverted digital signal of the digital signal. The second transistor is connected to the output of the first transistor.

28 Claims, 10 Drawing Sheets

FIRST EMBODIMENT OF THE PRESENT INVENTION

D/A CONVERTOR OF THE
RELATED ART

D/A CONVERTOR OF THE RELATED ART

RELATIONSHIP BETWEEN DRAIN-SOURCE VOLTAGE AND DRAIN-SOURCE CURRENT

FIG.4(a)
(PRIOR ART)
GLITCH GENERATION BASED ON
THE PARASITIC CAPACITANCE
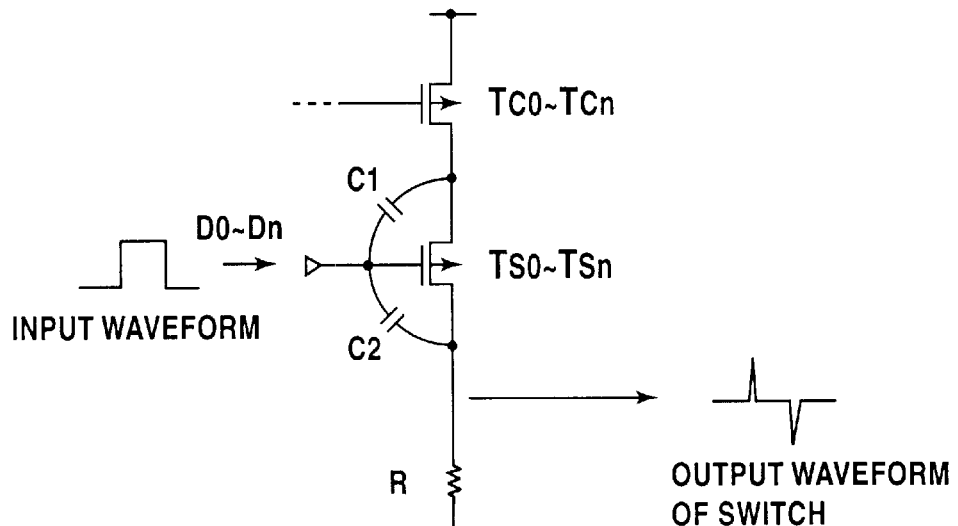
FIG.4(b)
(PRIOR ART)
FIG.5
(PRIOR ART)
D/A CONVERTOR OF THE
RELATED ART
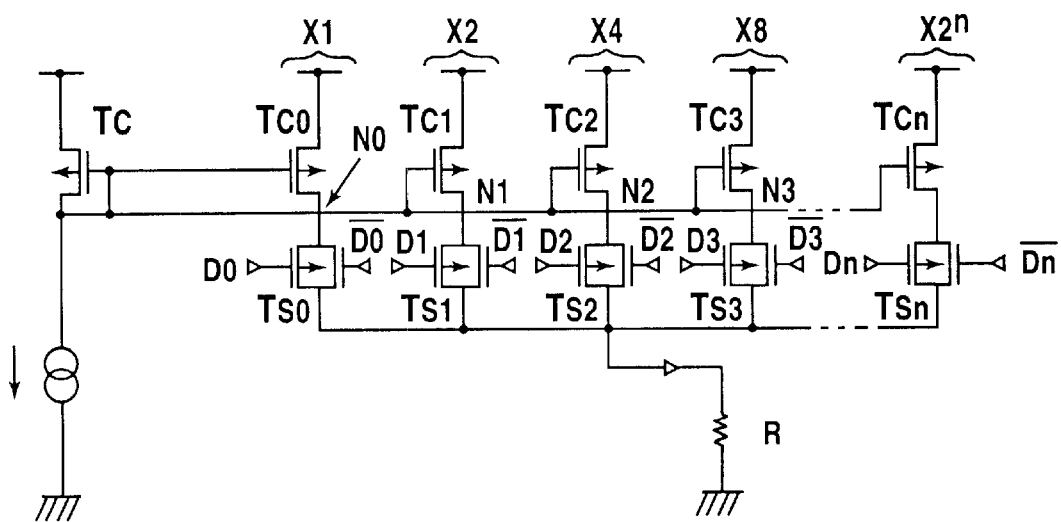

FIRST EMBODIMENT OF THE PRESENT INVENTION

REASON WHY CANCELING THE GLITCH BASED ON THE PARASITIC CAPACITANCE

FIG.7(b) WAVEFORM OF SWITCH Tv

+

FIG.7(c) WAVEFORM OF DUMMY Tv

=

FIG.7(d) OUTPUT WAVEFORM

FIG.8(a)

FORMATION OF DEPLETION LAYER BASED ON THE POTENTIALS OF SOURCE AND DRAIN

WHEN THE POTENTIALS OF S(SOURCE) AND D(DRAIN) ARE DIFFERENT:

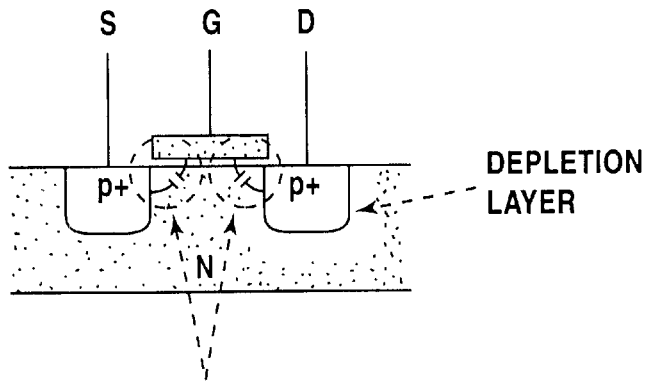

PARASITIC CAPACITANCE VALUE IS DIFFERENT BECAUSE THE DEPLETION LAYERS ARE FORMED IN THE DIFFERENT MANNERS.

FIG.8(b)

WHEN THE POTENTIALS OF S(SOURCE) AND D(DRAIN) ARE IDENTICAL:

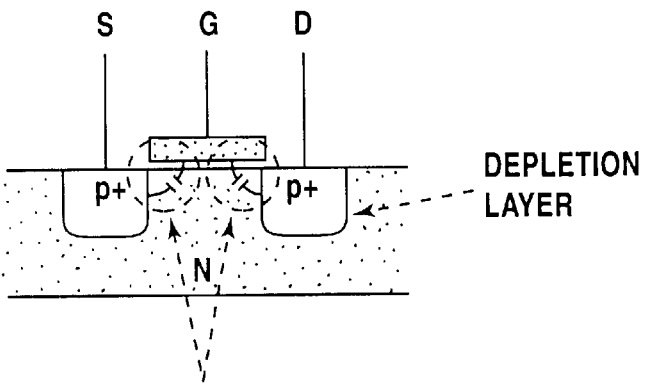

PARASITIC CAPACITANCE VALUES ARE IDENTICAL BECAUSE THE DEPLETION LAYERS ARE FORMED IN THE DIFFERENT MANNERS.

SECOND EMBODIMENT OF THE PRESENT INVENTION

THIRD EMBODIMENT (1) OF THE PRESENT INVENTION

THIRD EMBODIMENT (2) OF THE
PRESENT INVENTION

FOURTH EMBODIMENT OF THE PRESENT INVENTION

FIFTH EMBODIMENT OF THE PRESENT INVENTION

SIXTH EMBODIMENT OF THE
PRESENT INVENTION

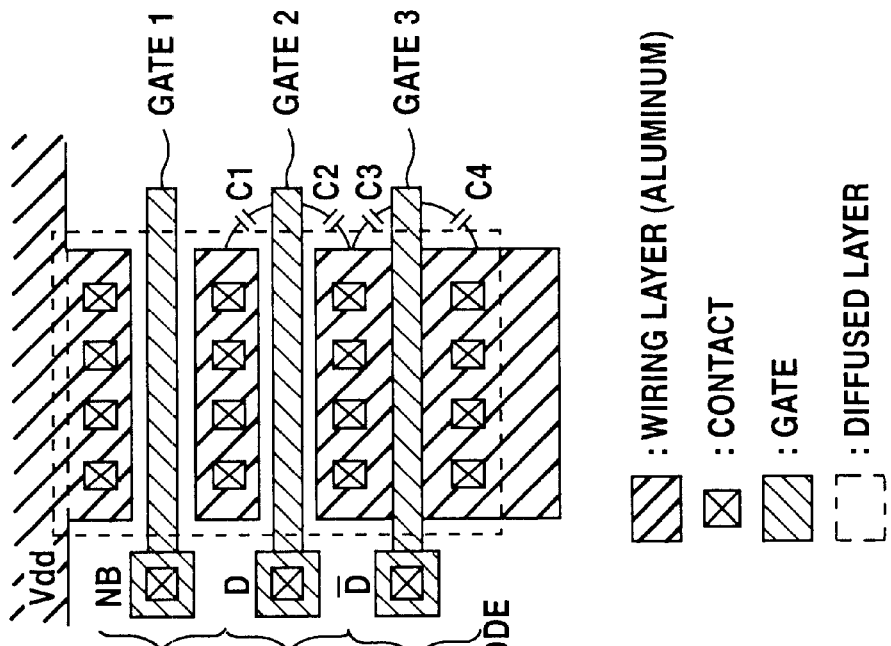
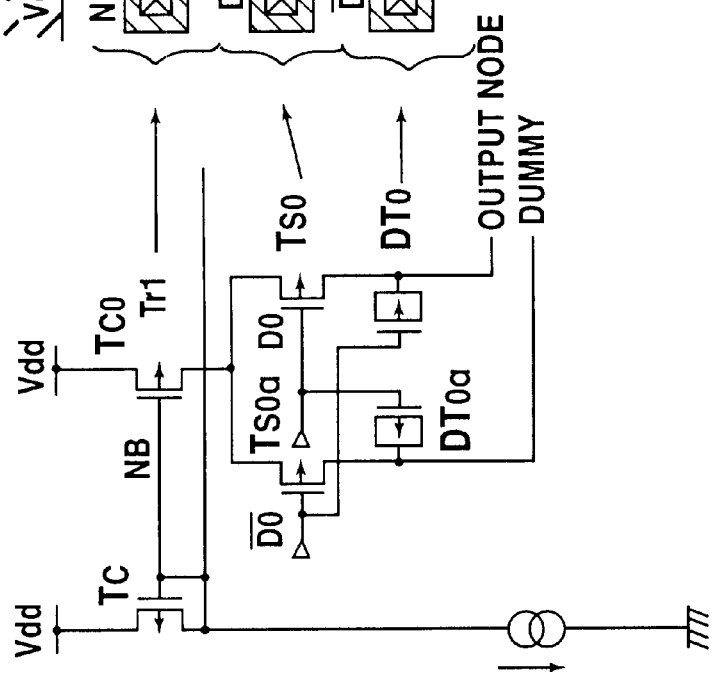

DIGITAL/ANALOGY CONVERTER FOR REDUCING GLITCH

BACKGROUND OF THE INVENTION

The present invention relates to a Digital/Analog ("D/A") converter for reducing a glitch when an input digital signal varies.

In a D/A converter, transitional spike and overshoot noises are generated in an output analog signal when an input digital signal varies. These noises are called the glitch. Therefore, it is essential to remove such glitch in order to achieve highly accurate digital/analog conversion.

FIG. 1 illustrates a D/A converter of the related art.

The D/A converter illustrated in FIG. 1 is structured by a plurality of current sources formed of current Miller circuits. An analog signal corresponding to the input digital signal is outputted by switching a current source on the basis of the input digital signals D0, D1, . . . , Dn (defined as the D/A converter of n bits). Namely, the input digital signals D0 to Dn are supplied to a plurality of P-channel transistors TS0 to TSn. The plurality of P-channel transistors TS0 to TSn execute the switching operation to select a current source on the current Miller circuit corresponding to the input digital signal. A current flows from the selected current Miller circuit and thereby an analog signal can be extracted from a load R.

The current Miller circuit is weighted. In FIG. 1, the weighting is executed, for example, on the basis of the ratio of the channel width W and channel length L (W/L) of the transistors TC0 to TCn (hereinafter, referred to as a current source transistor) forming one of the transistors of the current Miller circuit. In FIG. 1, reference numbers X1, X2, X4, . . . , X2$^n$ indicated at the upper part of the current source transistors TC0 to TCn represent the weighting. Moreover, the P-channel transistors TS0 to TSn for selecting the current Miller circuit are often given the weighting corresponding to the current source transistors TC0 to TCn. Uniformity in the D/A converter can be maintained to enhance the accuracy by setting equal the ratios of the P-channel transistors TS0 to TSn and the current source transistors TC0 to TCn.

FIG. 2 illustrates another D/A converter of the related art.

The D/A converter illustrated in FIG. 2 is an improved D/A converter of the D/A converter illustrated in FIG. 1.

According to the D/A converter illustrated in FIG. 1, it is assumed, for example, that when the least significant bit signal D0 of the digital signal becomes "1", the P-channel transistor TS0 turns OFF. When the P-channel transistor TS0 turns OFF, the node N0 connecting the P-channel transistor TS0 and the current source transistor TC0 is floated. Therefore, charges are accumulated in the node N0 due to a current from the current source (current Miller circuit formed of the current source transistor TC and current source transistor TC0), and the potential of the node N0 rises. When the potential of the node N0 rises, a drain-source voltage Vds of the current source transistor TC0 becomes small. Therefore, when next time the transistor TS0 is turned ON, the current source transistor TC0 momentarily does not perform the constant current operation as illustrated in FIG. 3 because a drain-source voltage Vds of the current source transistor TC0 is too small. As shown in FIG. 3, a drain-source voltage Vds is plotted on the lateral axis, while a drain-source current Ids is plotted on the vertical axis. FIG. 3 indicates that the drain-source current Ids does not become the constant current when the drain-source voltage Vds does not reach the constant value. As explained above, a current smaller than the predetermined constant current is momentarily supplied from the current source transistor TC0 and this current generates a glitch.

In the D/A converter illustrated in FIG. 2, the second P-channel transistors TS0a to TSna are connected respectively in parallel to the first P-channel transistors TS0 to TSn that perform the switching operation. The second P-channel transistors TS0a to TS0na are respectively fed with inverted signals /D0, /D1, . . . , /Dn ("/" means a bar) of the input digital signals D0, D1, . . . , Dn. Moreover, the sources of the second P-channel transistors TS0a to TSna are connected with dummy loads DR.

Since the inverted signal of the input digital signal is supplied to the second P-channel transistor corresponding to the first P-channel transistors TS0 to TSn which are turned OFF based on the input digital signal, the corresponding second P-channel transistors are turned ON. A current flows into the dummy load DR via the second P-channel transistors during the ON state. For example, the corresponding second P-channel transistor TS0a turns ON and a current flows into the dummy load DR even when the first P-channel transistor TS0 turns OFF and the current source transistor TC0 is not selected. As such, a current flows through node N0 connecting the current source transistor TC0 and the first P-channel transistor TS0, and thereby, node N0 is never floated and charges are never accumulated. Accordingly, a drain-source voltage Vds of the current source transistor TC0 does not become small and the current source transistor TC0 operates as a constant current source to control the generation of a glitch.

However, a glitch is generally generated in a D/A converter on the basis of the parasitic capacitance.

FIG. 4 illustrates parasitic capacitance in the first P-channel transistors TS0 to TSn. The parasitic capacitance C1 exists between the gate and drain, while the parasitic capacitance C2 exists between the gate and source in the first P-channel transistors TS0 to TSn. When a digital signal for changing over the switch is inputted to the gates of the first P-channel transistors TS0 to TSn, switching noise such as spike type glitch is generated as illustrated in FIG. 4(b) on the basis of the parasitic capacitances C1 and C2. This spike type glitch is generated in direct on an output waveform and thereby the accuracy of the analog/digital conversion is lowered to a large extent. Particularly, in the D/A converter illustrated in FIG. 2, the glitch based on the parasitic capacitance appears to be large because the glitch generated due to the reason other than the parasitic capacitance (glitch generated when a drain-source voltage Vds becomes small) is lowered.

Glitch based on the parasitic capacitance can be reduced by replacing the first P-channel transistors TS0 to TSn with the CMOS transistors as illustrated in FIG. 5. The glitch generated with the P-channel transistors and the glitch generated with the N-channel transistors cancel each other out by respectively supplying the signals of inverse phases to the P-channel transistor and N-channel transistor forming the CMOS transistor. However, in the CMOS transistor, the depletion layer of the P-channel transistors as well as the N-channel transistors is formed in different manners, and therefore, the parasitic capacitance are also different. Thus, waveform and amplitude of the glitch generated are different and they never cancel each other out.

SUMMARY OF THE INVENTION

In order to solve the problems explained above, the present invention provides a D/A converter comprising a plurality of current sources and a selecting means for selecting a current source from the plurality of current sources on the basis of a digital signal, wherein the selecting means includes a first transistor in which the digital signal is supplied, and a second transistor connected to an output of the first transistor to receive an inverted digital signal.

Moreover, the present invention provides a D/A converter comprising a plurality of current sources and a selecting means for selecting a current source from the plurality of current sources on the basis of a digital signal, wherein the selecting means includes a first transistor in which the digital signal is supplied, a second transistor in which an inverted digital signal is supplied, a third transistor, with the same conductivity type as the first transistor, to receive an inverted digital signal, and a fourth transistor, with the same conductivity type as the second transistor, to receive the digital signal.

According to the D/A converter of the present invention, the glitch generated from the parasitic capacitance of a transistor included in the selecting means can be effectively canceled with the glitch generated from the parasitic capacitance of a transistor with the same conductivity type as the transistor explained above. Therefore, a highly accurate analog signal with controlled glitch can be obtained.

According to the present invention, the glitch generated on the basis of the parasitic capacitance of the transistors included in the selecting means for selecting a current source is canceled with the glitch generated on the basis of the parasitic capacitance of the transistor of the same conductivity type as above transistor to receive the inverted signal supplied to such transistor. Therefore, the present invention can provide a high precision D/A converter that can obtain analog signals where the glitches cancel each other out.

BRIEF DESCRIPTION OF THE DRAWINGS

FIG. 4($a$) is a diagram illustrating the generation of glitch based on the parasitic capacitance.

FIG. 4($b$) is a diagram illustrating the generation of glitch based on the parasitic capacitance.

FIG. 5 is a diagram illustrating a D/A converter of the related art.

FIG. 7($b$) is a diagram illustrating the reason for canceling the glitch based on the parasitic capacitance.

FIG. 7($c$) is a diagram illustrating the reason for canceling the glitch based on the parasitic capacitance.

FIG. 7($d$) is a diagram illustrating the reason for canceling the glitch based on the parasitic capacitance.

FIG. 8($a$) is a diagram illustrating the formation of depletion layer based on the potentials of source and drain.

FIG. 8($b$) is a diagram illustrating the formation of depletion layer based on the potentials of source and drain.

FIG. 11($b$) is a diagram illustrating a third embodiment (2) of the present invention.

FIG. 15($a$) is a diagram illustrating a seventh embodiment of the present invention.

FIG. 15($b$) is a diagram illustrating a seventh embodiment of the present invention.

DETAILED DESCRIPTION

First Embodiment

Figure 6:
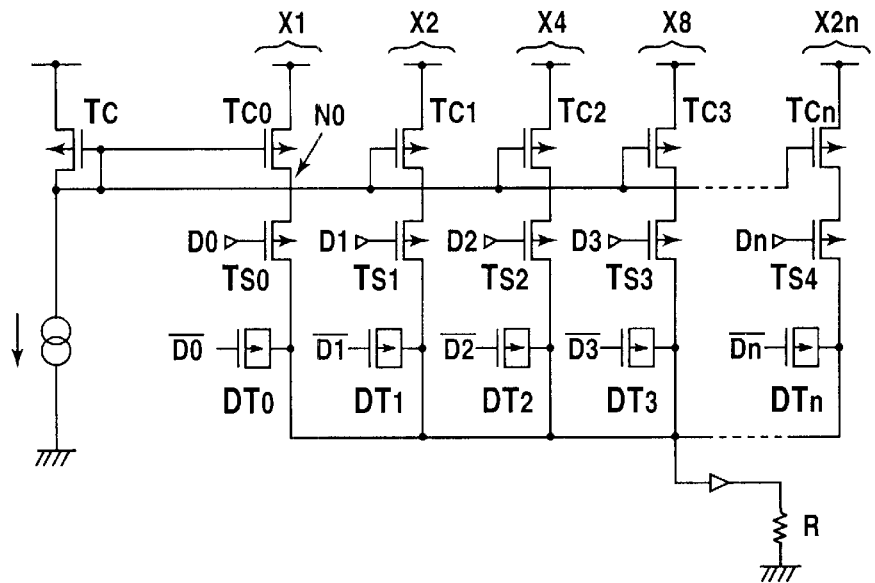
FIG. 6 is a diagram illustrating a first embodiment of the present invention.

FIG. 6 illustrates a first embodiment of the present invention.

Figure 1:
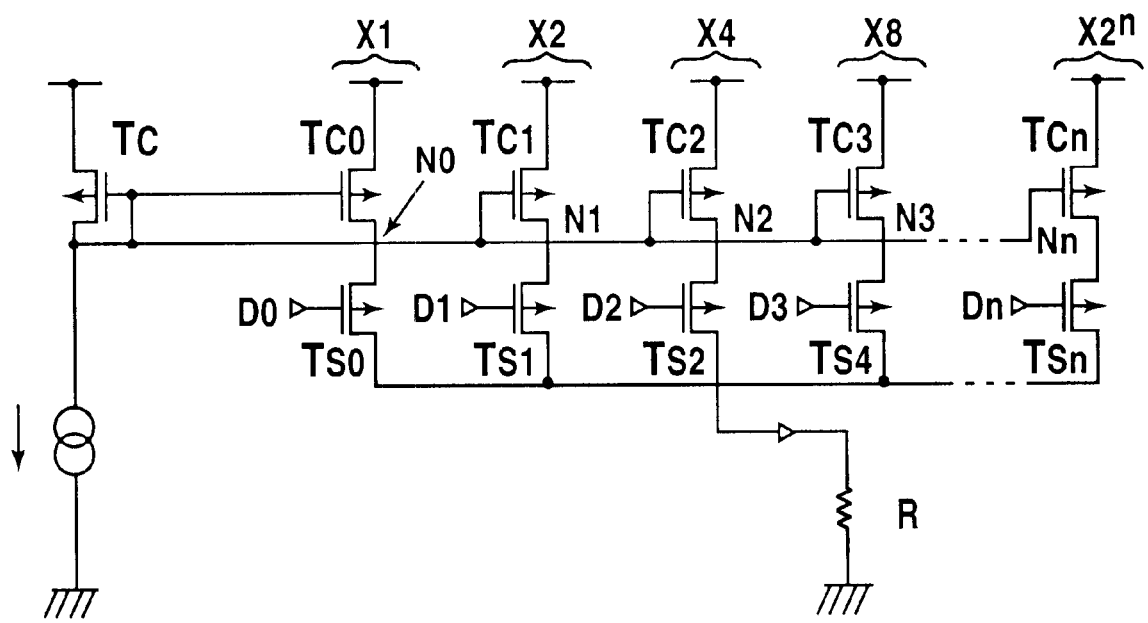
FIG. 1 is a diagram illustrating a D/A converter of the related art.

The D/A converter illustrated in FIG. 6 inserts first dummy P-channel transistors DT0 to DTn in which the source and drain are shorted to the D/A converter illustrated in FIG. 1.

Like the D/A converter illustrated in FIG. 1, the drain of the current source transistor TC0 is connected to the first P-channel transistor TS0. In the first embodiment of the present invention, the first dummy P-channel transistor DT0, wherein the source and drain are shorted, is inserted between the first P-channel transistor TS0 and a load R. The gate of the first dummy P-channel transistor DT0 is fed with an inverted signal /D0 of the input digital signal. Similarly, in the other power supply transistors TC1 to TCn, the first dummy P-channel transistors DT1 to DTn are connected and the gate thereof is fed with the inverted signals /D1 to /Dn of the input digital signal.

Figure 7A:
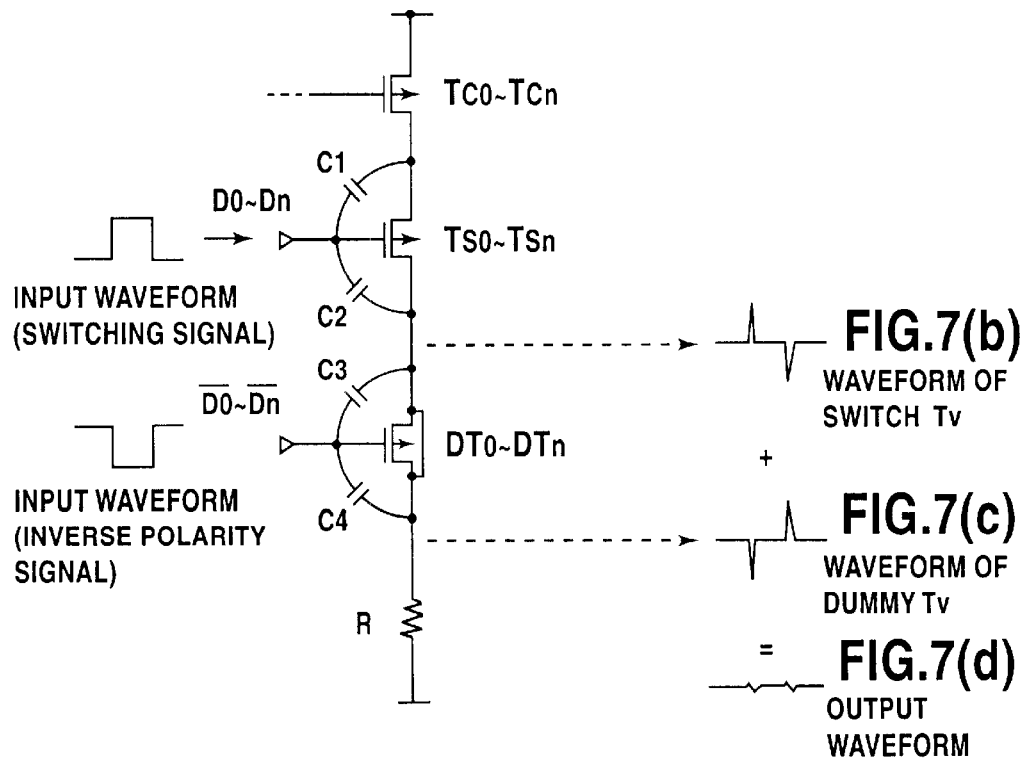
FIG. 7($a$) is a diagram illustrating the reason for canceling the glitch based on the parasitic capacitance.

FIG. 7 illustrates why the D/A converter of FIG. 6 can reduce the glitch based on the parasitic capacitance.

In the first P-channel transistors TS0 to TSn, the parasitic capacitance C1 exists between the gate and source, while the parasitic capacitance C2 exists between the gate and drain. When the digital signals D0 to D1 for changing over the switch are inputted to the gates of the first P-channel transistors TS0 to TSn, the switching noise, such as spike type glitch as illustrated in FIG. 6($b$), is generated based on the parasitic capacitances C1 and C2.

Moreover, the parasitic capacitance C3 exists between the gate and drain, and the parasitic capacitance C4 exists between the gate and source in the first dummy P-channel transistors DT0 to DTn. Accordingly, when the inverted signals /D0 to /Dn of the digital signal for changing over the switch are inputted to the gates of the first dummy P-channel transistors DT0 to DTn, the switching noise, such as spike type glitch as illustrated in FIG. 6($c$), is generated based on the parasitic capacitances C3 and C4.

However, since both the first P-channel transistors TS0 to TSn and the first dummy P-channel transistors DT0 to DTn are P-channel transistors, the depletion layer is formed in the same manner and the parasitic capacitance values are almost equal. Therefore, the amplitude (illustrated in FIG. 6($b$)) of spike type glitch generated from the first P-channel transistors TS0 to TSn is almost equal to the amplitude (illustrated in FIG. 6($c$)) of the spike type glitch generated from the first dummy P-channel transistors DT0 to DTn. However, since the digital signals inputted to the gates are inverted in phase with each other, glitch noises are generated in opposite directions of each other. Namely, glitch noises are generated to cancel each other out. As explained above, the glitch noises generated with parasitic capacitances cancel each other out, and the waveform of the current value obtained from the load R becomes flat as illustrated in FIG. 6(d). Therefore, the generation of glitch is controlled as much as possible.

As explained above, the first dummy P-channel transistors DT0 to DTn are inserted to cancel the noise generated by the parasitic capacitance in the first P-channel transistors TS0 to TSn.

The following explains the reason why the source and drain of the first dummy P-channel transistors DT0 to DTn are shorted.

(1) First Reason

The first dummy P-channel transistors DT0 to DTn are used to cancel the noise generated from the parasitic capacitance of the first P-channel transistors TS0 to TSn. Therefore, the first dummy P-channel transistors DT0 to DTn and the first P-channel transistors TS0 to TSn must execute the similar switching operation. For example, if the first dummy P-channel transistors are in the OFF state while the first P-channel transistors are in the ON state, then a current is not supplied to the load R from the current source. Therefore, the analog output corresponding to the input digital signal cannot be obtained. On the other hand, in order to play the role of canceling noises, the first dummy P-channel transistors DT0 to DTn and the first P-channel transistors TS0 to TSn must be transistors of the same conductivity type, and the signals of the inverse phases must be supplied to the gates thereof. As such, the first dummy P-channel transistors DT0 to DTn and the first P-channel transistors TS0 to TSn perform the different switching operations. Therefore, the sources and drains of the first dummy P-channel transistors DT0 to DTn are shorted in order to utilize the switching operations of the first P-channel transistors TS0 to TSn without relation to the switching operations of the first dummy P-channel transistors DT0 to DTn.

(2) Second Reason

The sources and drains of these transistors are shorted in order to maintain the sources and drains of the first dummy P-channel transistors DT0 to DTn in the same potential.

FIG. 8 illustrates the depletion layer formed under the gates, sources and drains of the first dummy P-channel transistors DT0 to DTn.

FIG. 8(a) illustrates the depletion layer formed when the potentials of the sources S and drains D are not identical. The shape of the depletion layer formed under the sources S is different from that which is formed under the drains D. Therefore, the parasitic capacitance generated between the gates and sources is different from that which is generated between the gates and drains. Accordingly, the glitch generated when the potentials of the sources S and drains D are not identical is different from the glitch generated when the first P-channel transistors TS0 to TSn is turned ON and therefore, these glitches cannot be canceled effectively with each other.

FIG. 8(b) illustrates a depletion layer formed when the potentials of the sources S and drains D are identical. The shape of the depletion layer formed under the sources is almost the same as the shape of depletion layer formed under the drains. Therefore, the parasitic capacitance generated between the gates and sources is almost identical to that of the parasitic capacitance generated between the gates and drains. Accordingly, the glitch generated, when the potentials of the sources S and drains D are identical, is identical to that of which is generated when the first P-channel transistors TS0 to TSn is turned ON. Therefore, these glitches can effectively cancel each other out.

Second Embodiment

Figure 9:
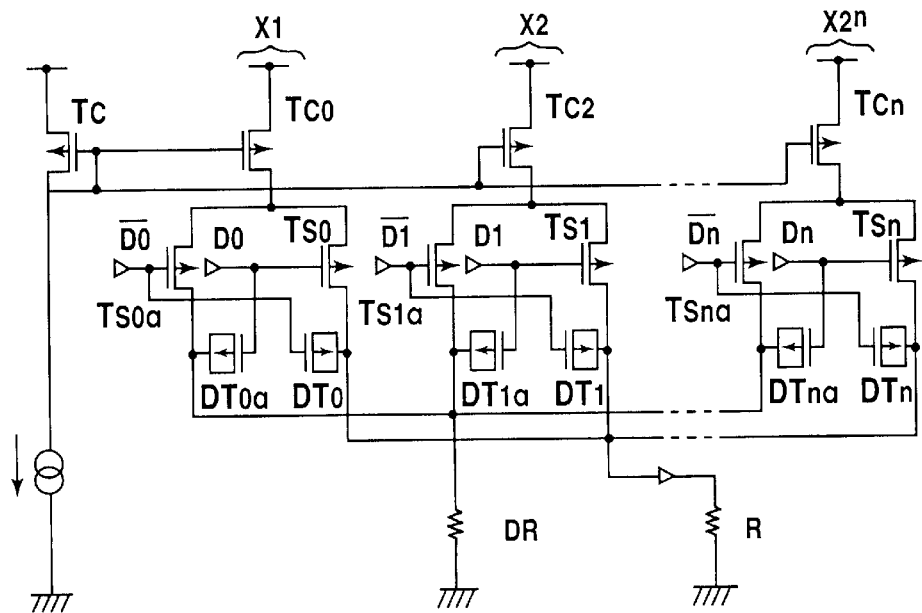
FIG. 9 is a diagram illustrating a second embodiment of the present invention.

FIG. 9 illustrates the second embodiment of the present invention.

The D/A converter illustrated in FIG. 9 inserts the first dummy P-channel transistors DT0 to DTn and the second dummy P-channel transistors DT0a to DTna at the place where the sources and drains are shorted.

Figure 2:
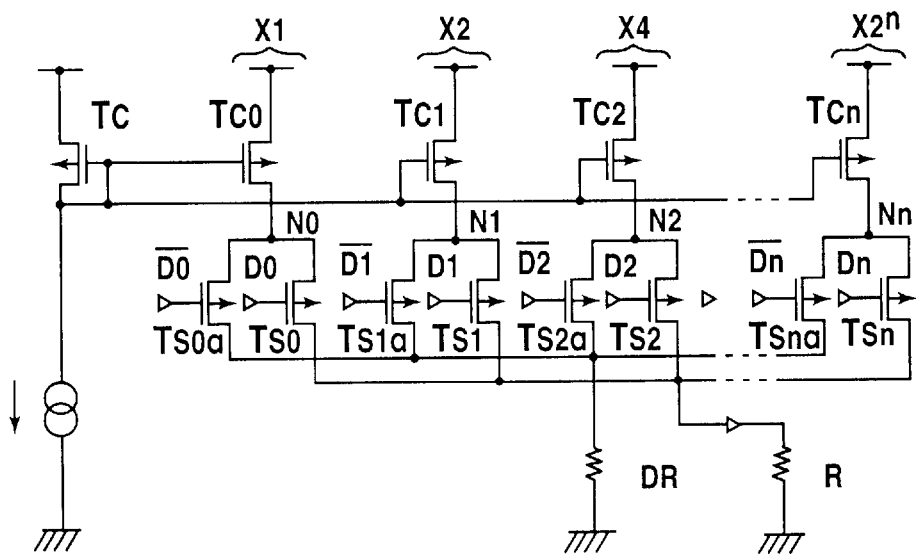
FIG. 2 is a diagram illustrating a D/A converter of the related art.
Figure 3:
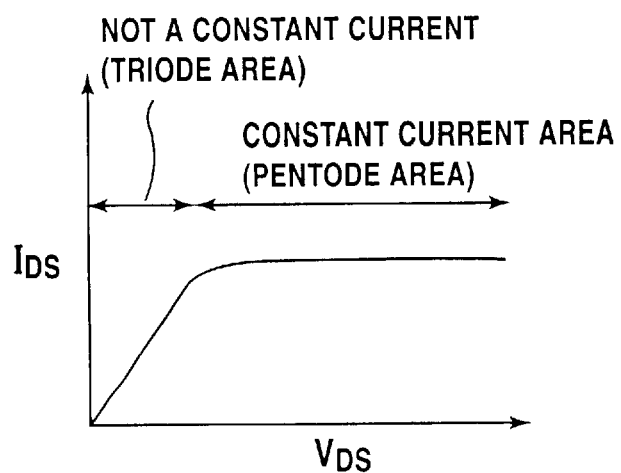
FIG. 3 is a diagram illustrating the relationship between the drain-source voltage and the drain-source current.

Like the D/A converter illustrated in FIG. 2, the drain of the current source transistor TC0 is connected with the first P-channel transistor TS0 and the second P-channel transistor TS0a. In the second embodiment of the present invention, the first dummy P-channel transistor DT0, wherein the source and drain are shorted, is inserted between the first P-channel transistor TS0 and the load R. The gate of the first dummy P-channel transistor DT0 is fed with the inverted signal /D0 of the input digital signal. Moreover, the second dummy P-channel transistor DT0a, wherein the source and drain are shorted, is inserted between the second P-channel transistor TS0a and the dummy load DR. Additionally, the gate of the second dummy P-channel transistor DT0a is fed with the input digital signal D0. Furthermore, in the other power supply transistors TC1 to TCn, the first dummy P-channel transistors DT1 to DTn are also connected in the same way, and the gate thereof is also fed with the inverted signals /D1 to /Dn of the input digital signal. Moreover, the second dummy P-channel transistors DT1a to DTna are also connected wherein the gate thereof is fed with the input digital signals D1 to Dn.

The D/A converter illustrated in FIG. 9, like the first embodiment of the present invention, illustrates that the first dummy P-channel transistors DT0 to DTn are inserted in order to cancel the noise generated on the basis of the parasitic capacitance of the first P-channel transistors TS0 to TSn. Moreover, the second dummy P-channel transistors DT0a to Dtna are inserted in order to cancel the noise generated on the basis of the parasitic capacitance of the second P-channel transistors TS0a to TSna.

Third Embodiment

Figure 10:
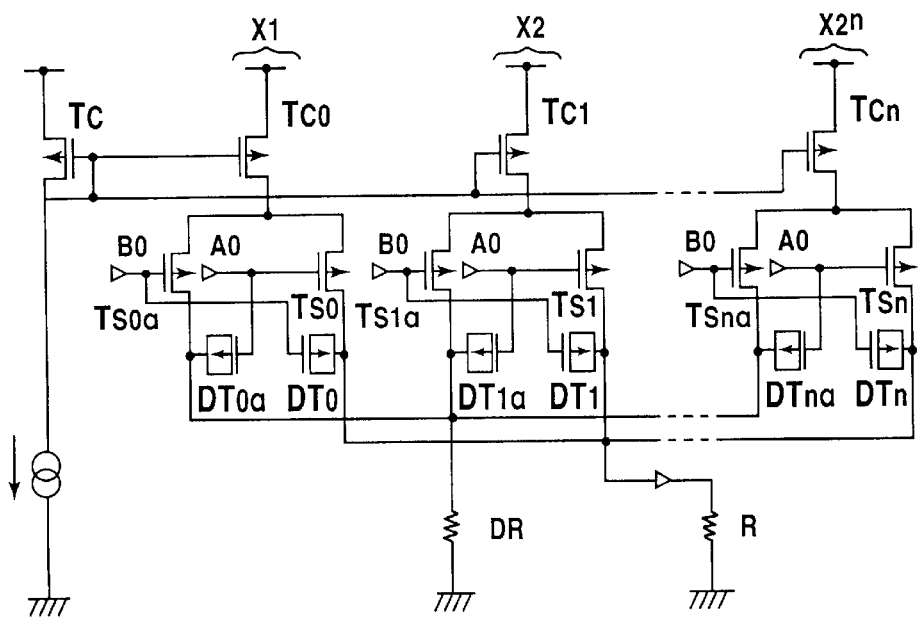
FIG. 10 is a diagram illustrating a third embodiment (1) of the present invention.
Figure 11A:
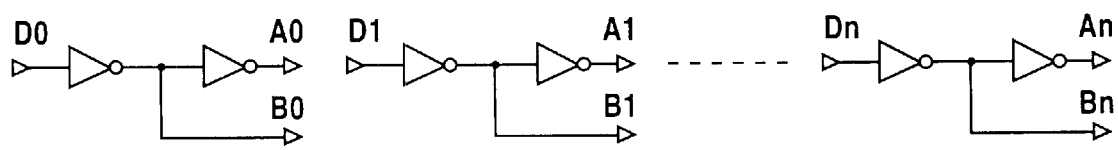
FIG. 11($a$) is a diagram illustrating a third embodiment (2) of the present invention.

FIG. 10 and FIG. 11 illustrate the third embodiment of the present invention.

The D/A converter illustrated in FIG. 10 is identical to the D/A converter illustrated in FIG. 9. However, the third embodiment of the present invention is characterized in the circuit to supply the digital signal to the D/A converter of FIG. 11(b).

In the D/A converter illustrated in FIG. 10, the input digital signals are indicated as A0 to An, while the inverted signals of input digital signals are indicated as B0 to Bn. The input digital signals A0 to An and the inverted signals B0 to Bn of the input digital signals are generated, for example, with the circuit illustrated in FIG. 11(a) and are then supplied to the D/A converter. However, when the original signals D0 to Dn of the input digital signal are inverted with an inverter and are then only supplied to the D/A converter, a time difference is generated between the input digital signals A0 to An and the inverted signals B0 to Bn of the input digital signal due to the delay in the inverter. Therefore, a time difference is also generated between the glitch generated on the basis of the parasitic capacitance of the first P-channel transistors TS0 to TSn and the glitch generated on the basis of the parasitic capacitance of the first dummy P-channel transistors DT0 to DTn, and therefore, these glitches cannot effectively cancel each other out in some cases. Accordingly, the input digital signals A0 to An and the inverted signals B0 to Bn of the input digital signal can be generated using the circuit illustrated in FIG. 11(b).

Figure 11B:
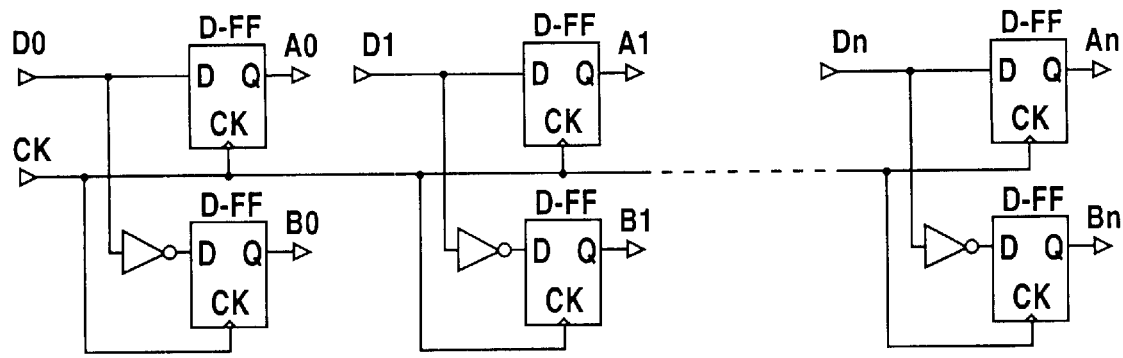

The circuit illustrated in FIG. 11(b) supplies the input digital signals A0 to An and the inverted signals B0 to Bn of the input digital signal to the D/A converter via the flip-flop circuit. When the input digital signals A0 to An and the inverted signals B0 to Bn of the input digital signals are supplied synchronously to the D/A converter, the glitches are generated without any time difference and these glitches can effectively cancel each other out.

As such, since it is sufficient that when the input digital signals A0 to An and the inverted signals B0 to Bn of the input digital signals be supplied to the D/A converter, the other circuit, if it can synchronously outputs the signals, may be replaced with such flip-flop circuit.

Fourth Embodiment

Figure 12:
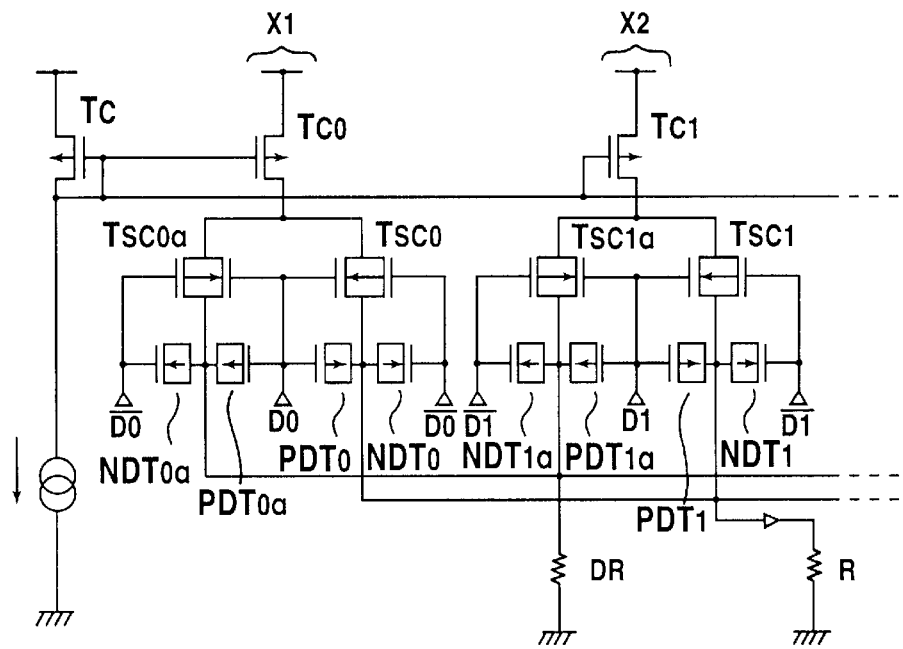
FIG. 12 is a diagram illustrating a fourth embodiment of the present invention.

FIG. 12 illustrates the fourth embodiment of the present invention.

In the D/A converter illustrated in FIG. 12, the first P-channel transistors TS0 to TSn of the D/A converter illustrated in FIG. 9 are replaced with the first CMOS transistors TSC0 to TSCn, while the second P-channel transistors TS0a to TS0n are replaced with the second CMOS transistors TSC0a to TSCna.

The glitch generated from the P-channel transistors forming the first CMOS transistors TSC0 to TSCn is canceled with the glitch generated from the first dummy P-channel transistors PDT0 to PDTn.

The glitch generated from the N-channel transistors forming the first CMOS transistors TSC0 to TSCn is canceled with the glitch generated from the first dummy N-channel transistors NDT0 to NDTn.

The glitch generated from the P-channel transistors forming the second CMOS transistors TSC0a to TSCna is canceled with the glitch generated from the second dummy P-channel transistors PDTa0 to PDTan.

The glitch generated from the N-channel transistors forming the second CMOS transistors TS0a to TSna is canceled with the glitch generated from the second dummy N-channel transistors NDT0a to NDTna.

According to the cancellation of the above glitches, an output waveform without any glitches can be attained from the load R.

Fifth Embodiment

Figure 13:
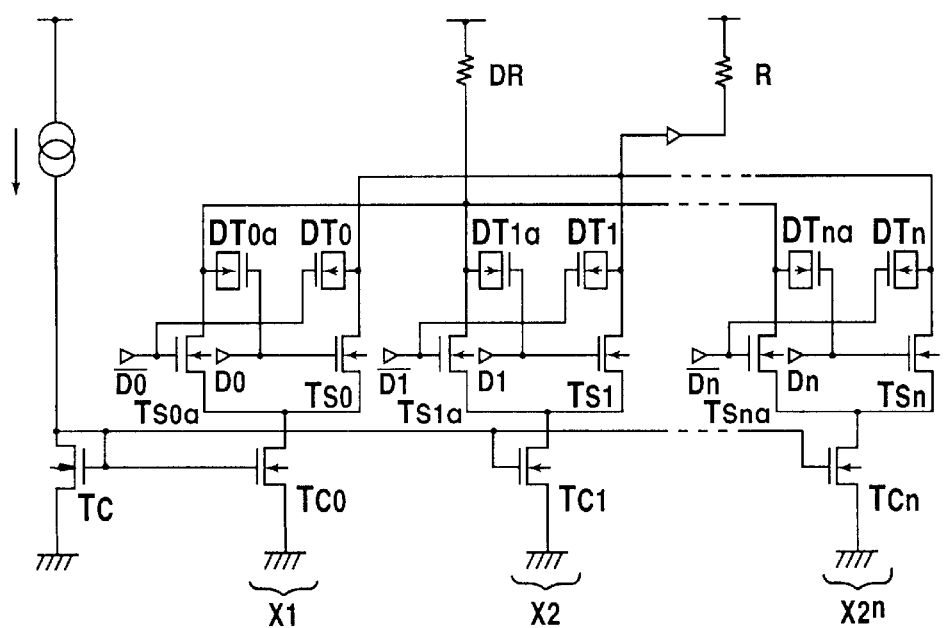
FIG. 13 is a diagram illustrating a fifth embodiment of the present invention.

FIG. 13 illustrates the fifth embodiment of the present invention.

The D/A converter illustrated in FIG. 13 replaces the source type current output D/A converter illustrated in FIG. 9 with a sink type current output D/A converter.

The glitch generated from the first P-channel transistors TS0 to TSn is canceled with the glitch generated from the first dummy P-channel transistors DT0 to DTn in the sink type current output D/A converter illustrated in FIG. 13.

The glitch generated from the second P-channel transistors TS0a to TSna is canceled with the glitch generated from the second dummy P-channel transistors DT0a to DTna.

Sixth Embodiment

Figure 14:
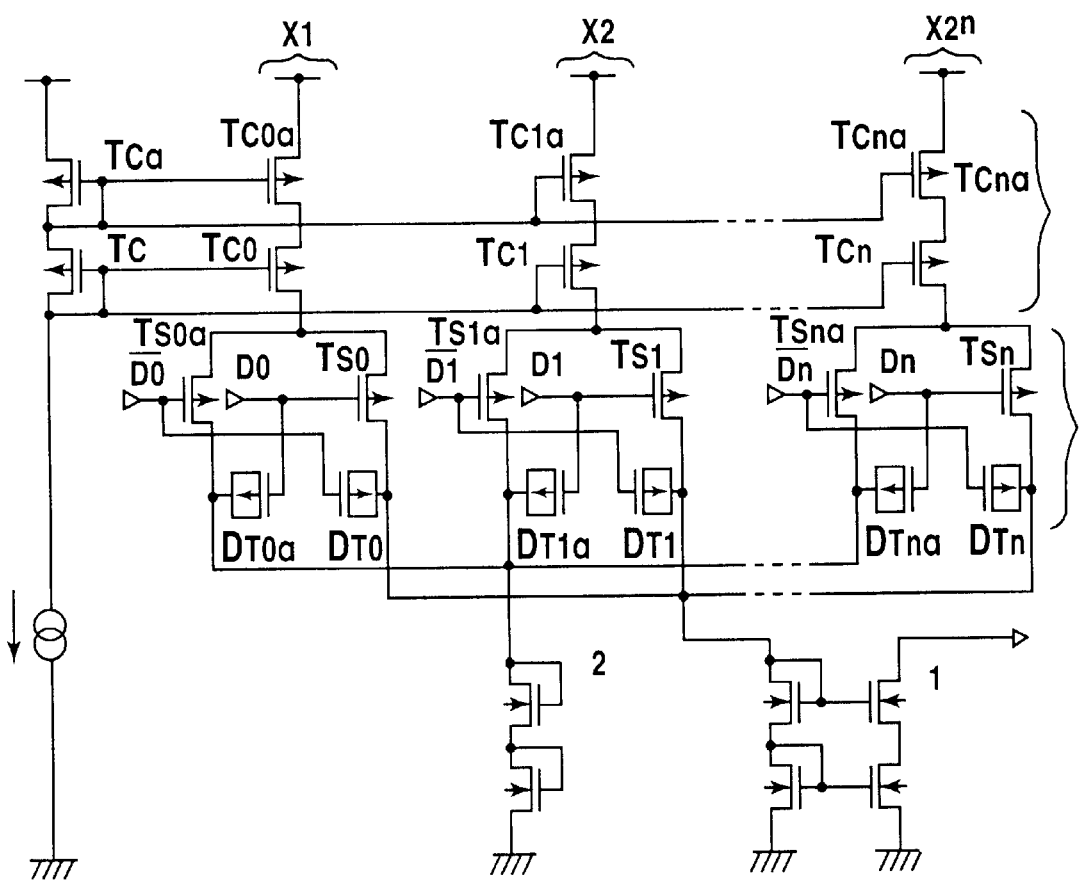
FIG. 14 is a diagram illustrating a sixth embodiment of the present invention.

FIG. 14 illustrates the sixth embodiment of the present invention.

The D/A converter illustrated in FIG. 14 replaces the current Miller circuit of the D/A converter illustrated in FIG. 9 with a Wideler type current Miller circuit.

The Wideler type current Miller circuit cascade-connects a pair of transistors forming the current Miller circuit and assures higher current accuracy.

Moreover, the D/A converter illustrated in FIG. 14 uses a current Miller circuit 1 as a load and also uses a circuit 2, as a dummy load, cascade-connecting the transistors where the gate and drain are connected.

In the D/A converter illustrated in FIG. 14, the glitch generated from the first P-channel transistors TS0 to TSn is canceled with the glitch generated from the first dummy P-channel transistors DT0 to DTn.

The glitch generated from the second P-channel transistors TS0a to TSna is canceled with the glitch generated from the second dummy P-channel transistors DT0a to DTna.

Seventh Embodiment

FIG. 15 illustrates the seventh embodiment of the present invention.

FIG. 15(a) illustrates a part of the circuit for selecting a current source of the D/A converter as illustrated in FIG. 9, while FIG. 15(b) illustrates the layout corresponding to the circuit illustrated in FIG. 15(a).

In FIG. 15(b), the signal NB is fed to the gate 1 of the transistor TC0 and this transistor TC0 operates as a current source. Moreover, the digital signal D0 is fed to the gate 2 of the first P-channel transistor TS0 and this first P-channel transistor TS0 operates as a switch. The inverted signal /D0 of the digital signal is fed to the gate 3 of the first dummy P-channel transistor DT0 and this first dummy P-channel transistor DT0 operates to cancel the glitch. Namely, the glitches are generated based on the parasitic capacitance C1 between the gate and source of the first P-channel transistor TS0 and the parasitic capacitance C2 between the gate and drain thereof. However, these glitches are canceled with the glitches of the inverse phases generated based on the parasitic capacitance C3 between the gate and drain of the first dummy P-channel transistor DT0 and the parasitic capacitance C4 between the gate and source thereof. Therefore, since the glitches generated in the gate 2 and gate 3 cancel each other out, these glitches are not transferred to the output node. Therefore, a current without glitches can be obtained from the output node.

What is claimed is:

1. A Digital/Analog converter for converting a digital signal to an analog signal, comprising:
 a plurality of current sources; and
 a selecting circuit for selecting a current source from said plurality of current sources on the basis of the digital signal;
 said selecting circuit to comprising:
  a first transistor which the digital signal is supplied; and
  a second transistor with the same conductivity type transistor as the first transistor, for receiving an inverted digital signal of the digital signal, said second transistor being connected to the output of said first transistor,
  wherein a first noise generated by the first transistor is eliminated by a second noise generated by the second transistor.

2. A Digital/Analog converter according to claim 1, wherein the source and the drain of said second transistor are connected to each other.

3. A Digital/Analog converter according to claim 1, further including an output circuit, wherein said second transistor is connected with said output circuit for outputting the analog signal.

4. A Digital/Analog converter for converting a digital signal to an analog signal comprising:
   a plurality of current sources; and
   a selecting circuit for selecting a current
   a selecting circuit for selecting a current source from said plurality of current sources on the basis of the digital signal;
   said the selecting circuit comprising:
      a first transistor to which the digital signal is supplied; and
      a second transistor with the same conductivity type as the first transistor for receiving an inverted digital signal of the digital signal, wherein the source and the drain of the second transistor are connected to each other.

5. A Digital/Analog converter according to claim 4, wherein an output of said first transistor is connected to said second transistor.

6. A Digital/Analog converter according to claim 4, including an output circuit, wherein said second transistor is connected to said output circuit for outputting the analog signal.

7. A Digital/Analog converter for converting a digital signal to an analog signal, comprising:
   a plurality of current sources; and
   a selecting circuit for selecting a current source from said plurality of current sources on the basis of the digital signal;
   said selecting circuit including a first transistor to which the digital signal is supplied;
   a second transistor to which an inverted digital signal of the digital signal is supplied;
   a third transistor with the same conductivity type as the first transistor for receiving the inverted digital signal of the digital signal; and
   a fourth transistor with the same conductivity type as the second transistor for receiving the digital signal.

8. A Digital/Analog converter according to claim 7, wherein the source and the drain of said third transistor are connected to each other and the source and the drain of said forth transistor are connected to each other.

9. A Digital/Analog converter according to claim 7, including an output circuit, wherein said first and third transistors are connected with said output circuit for outputting the analog signal.

10. A Digital/Analog converter according to claim 7, further including at least one load, wherein said second and fourth transistors are connected to said at least one load.

11. A digital/analog converter according to claim 7, further comprising a circuit for synchronizing the digital signal and the inverted digital signal, thereby for supplying the synchronized digital signal to the first transistor and the fourth transistor and for supplying the synchronized inverted digital signal to the second transistor and the third transistor.

12. A Digital/Analog converter according to claim 7, wherein the first and second transistors are CMOS transistors.

13. A Digital/Analog converter according to claim 7, wherein the converter is a source type current output or a sink type current output.

14. A Digital/Analog converter according to claim 7, wherein the current source includes a current miller circuit.

15. A Digital/Analog converter according to claim 7, wherein the current source includes a current Miller circuit and a pair of transistors, the pair of transistors being cascade-connected in the multiple stages.

16. A Digital/Analog converter for converting a digital signal to an analog signal, comprising:
   a plurality of current sources; and
   a selecting circuit for selecting a current source from said plurality of current sources on the basis of the digital signal;
   said selecting circuit comprising:
      a first transistor to which the digital signal is supplied;
      a second transistor to which an inverted digital signal of the digital signal is supplied;
      a third transistor for receiving the inverted digital signal of the digital signal, wherein said third transistor is connected to the output of the first transistor; and
      a fourth transistor for receiving the digital signal, wherein said fourth transistor is connected to the output of the second transistor.

17. A Digital/Analog converter according to claim 16, wherein the source and the drain of the third transistor are connected to each other and the source and the drain of the forth transistor are connected to each other.

18. A Digital/Analog converter for converting a digital signal to an analog signal, comprising:
   a plurality of current sources; and
   a selecting circuit for selecting a current source from said plurality of current sources on the basis of the digital signal;
   said selecting circuit comprising:
      a first transistor in which the digital signal is supplied;
      a second transistor in which an inverted digital signal of the digital signal is supplied;
      a third transistor with the same conductivity type as the first transistor, connected to the output of the first transistor; and
      a fourth transistor with the same conductivity type as the second transistor, connected to the output of the first transistor.

19. A Digital/Analog converter according to claim 18, wherein the source and the drain of the third transistor are connected to each other and the source and the drain of the forth transistor are connected to each other.

20. A Digital/Analog converter for converting a digital signal to an analog signal including a first noise generated by inputting the digital signal, comprising:
   a plurality of current sources;
   a selecting circuit for selecting a current source from the plurality of current sources on the basis of the digital signal; and
   a noise generating circuit for generating a second noise which has an inverse phase of the first noise to eliminate the first noise.

21. A Digital/Analog converting method for converting a digital signal to an analog signal including a first noise generated by inputting the digital signal comprising:
   selecting a current source from a plurality of current sources on the basis of the digital signal;
   generating a second noise which has an inverse phase of the first noise; and
   generating an analog signal where the first noise and the second noise are eliminated by each other.

22. A Digital/Analog converter for converting a digital signal to an analog signal, comprising:
   a plurality of current sources; and
   a selecting circuit for selecting a current source from said plurality of current sources on the basis of the digital signal;
   said selecting circuit comprising:
      a first transistor in which the digital signal is supplied; and
      a second transistor with the same conductivity type transistor as the first transistor, for receiving an inverted digital signal of the digital signal, said second transistor being connected to the output of said first transistor, wherein the source and the drain of said second transistor are connected to each other.

23. A Digital/Analog converter according to claim 22, further including an output circuit, wherein said second transistor is connected with said output circuit for outputting the analog signal.

24. A Digital/Analog converter for converting a digital signal to an analog signal, comprising:
   a plurality of current sources; and
   a selecting circuit for selecting a current source from said plurality of current sources on the basis of the digital signal;
   said selecting circuit comprising:
      a first transistor in which the digital signal is supplied; and
      a second transistor with the same conductivity type transistor as the first transistor, for receiving an inverted digital signal of the digital signal, said second transistor being connected to the output of said first transistor,
      wherein a first noise generated by supplying the digital signal to the first transistor is eliminated by a second noise generated by receiving the inverted digital signal.

25. A Digital/Analog converter for converting a digital signal to an analog signal, comprising:
   a plurality of current sources; and
   a selecting circuit for selecting a current source from said plurality of current sources on the basis of the digital signal; and
   said selecting circuit comprising:
      a first noise generating circuit for generating a second noise which has an inverse phase of the first noise to eliminate the first noise; and
      a second noise generating circuit for generating a second noise which has an inverse phase of the first noise to eliminate the first noise.

26. A Digital/Analog converter for converting a digital signal to an analog signal, comprising:
   a plurality of current sources; and
   a selecting circuit for selecting a current source from said plurality of current sources on the basis of the digital signal; said selecting circuit comprising:
      a first noise generating circuit for generating a first noise by being inputted in the digital signal; and
      a second noise generating circuit for generating a second noise which has an inverse phase of the first noise and has a sufficient magnitude to cancel the first noise.

27. A Digital/Analog converter for converting a digital signal to an analog signal including a first noise generated by inputting the digital signal, comprising:
   a plurality of current sources;
   a selecting circuit for selecting a current source from said plurality of current sources on the basis of the digital signal; and
   a noise generating circuit for generating a second noise which has substantially a magnitude of the first noise and has an inverse phase of the first noise to cancel the first noise.

28. A Digital/Analog converting method for converting a digital signal to an analog signal including a first noise generated by inputting the digital signal comprising:
   selecting a current source from a plurality of current sources on the basis of the digital signal;
   generating a second noise which has substantially a magnitude of the first noise and has an inverse phase of the first noise; and
   generating an analog signal where the first noise and the second noise are canceled with each other.

* * * * *